United States Patent [19]

Brody

[11] Patent Number: 5,426,074
[45] Date of Patent: Jun. 20, 1995

[54] PROCESS FOR FABRICATING AN ACTIVE MATRIX CIRCUIT

[76] Inventor: Thomas P. Brody, 5823 Kentucky Ave., Pittsburgh, Pa. 15232

[21] Appl. No.: 219,663

[22] Filed: Mar. 29, 1994

Related U.S. Application Data

[63] Continuation of Ser. No. 855,523, Mar. 23, 1992, Pat. No. 5,352,634.

[51] Int. Cl.$^6$ ........................................... H01L 21/302
[52] U.S. Cl. ........................................................ 437/228
[58] Field of Search .............................. 101/491, 492; 156/659.1, 660; 437/229, 228; 29/829

[56] References Cited

U.S. PATENT DOCUMENTS

| | | | |
|---|---|---|---|
| 72,553 | 12/1867 | Skinner . | |
| 2,441,960 | 5/1948 | Eisler | 41/43 |
| 2,587,568 | 2/1952 | Eisler | 41/43 |
| 3,415,699 | 12/1968 | Brown | 156/13 |
| 3,485,688 | 12/1969 | Irvine | 156/11 |
| 3,573,456 | 4/1971 | Beeh | 250/65 |
| 4,294,650 | 10/1981 | Werthmann | 156/660 |
| 4,505,685 | 3/1985 | Tischler et al. | 445/24 |
| 4,549,928 | 10/1985 | Blanding et al. | 156/660 |
| 4,555,414 | 11/1985 | Hoover et al. | 427/43.1 |
| 4,557,798 | 12/1985 | Blanding et al. | 156/660 |
| 4,690,833 | 9/1987 | Donson et al. | 427/96 |
| 4,752,353 | 6/1988 | Blanding et al. | 156/660 |
| 4,829,014 | 5/1989 | Yerman | 437/8 |
| 4,869,778 | 9/1989 | Cote | 156/635 |
| 4,913,674 | 4/1990 | Nicholas | 445/24 |
| 4,945,352 | 7/1990 | Ejiri | 340/805 |
| 4,982,273 | 1/1991 | Brody | 358/59 |
| 5,066,360 | 11/1991 | Daley et al. | 156/660 |
| 6,803,136 | 2/1989 | Bowsky et al. | 429/56 |

FOREIGN PATENT DOCUMENTS

| | | | |
|---|---|---|---|
| 61-147595 | 7/1986 | Japan | 156/660 |
| 3-54569 | 3/1991 | Japan . | |
| 0829354 | 3/1960 | United Kingdom | 156/660 |

OTHER PUBLICATIONS

Topfer, Morton L.; Thick-Film Microelectronics, Fabrication, Design and Applications; Van Nostrand Reinhold; 1971; pp. 60–87.

Roddy, D.; Introduction to Microelectronics, Second Edition; Pergamon Press; pp. 149–153.

McGraw-Hill Encyclopdeia of Science & Technology, 6th Edition, vol. 14; McGraw-Hill Book Company; pp. 270–275.

McGraw-Hill Encyclopedia of Science & Technology, 6th Edition, vol. 9; McGraw-Hill Book Company; pp. 249–251.

Lund, Preben; Generation of Precision Artwork for Printed Circuit Boards; John Wiley & Sons, Inc.; 1978; pp.17–25.

Brodie, Ivor and Muray, Julius J.; The Physics of Microfabrication; Plenum Press; 1982; pp. 1–3 and 267–271.

McGreivy, Denis J. and Pickar, Kenneth A.; VLSI Technologies Through The 80s and Beyond; IEEE Computer Society Press; 1982; pp. 55–61.

Ong, DeWitt G.; Modern MOS Technology; Processes, Devices, and Design; McGraw-Hill, Inc.; 1984; pp. 174–179.

DeForest, W. S.; Photoresist Materials and Processes; McGraw-Hill, Inc.; 1975; pp. 1–19.

(List continued on next page.)

Primary Examiner—Mary Wilczewski
Attorney, Agent, or Firm—Webb Ziesenheim Bruening Logsdon Orkin & Hanson

[57] ABSTRACT

An improved method of fabricating integrated circuits, particularly active matrix arrays. The present method comprises applying an etch-resist pattern to an integrated circuit by printing to form resist patterns. The circuit is then etched, recoated with a different substance, a new ink pattern applied and the pattern repeated to form the successive layers of the integrated circuit.

4 Claims, 2 Drawing Sheets

OTHER PUBLICATIONS

Clark, Raymond H.; Printed Circuit Engineering Optimizing for Manufacturability; Van Nostrand Reinhold; 1989; pp. 44–51.

Gise, Peter and Blanchard, Richard; Modern Semiconductor Fabrication Technology; Prentice–Hall; 1986; pp. 51–69.

Mori, Yuji et al.; A New Process Concept for Large-Area Patterning-A Large-Area Transistor Circuit Fabrication without Using Optical Mask Aligner (GTC Corporation, SID 91 Digest); pp. 561–562.

Okazaki et al.; A TFT Fabrication by Gravure Offset Printing without Mask Aligner (GTC Corporation, SID 91 Digest); 563–564.

Hayama et al.; Characteristics for Printed Resist TFTs (GTC Corporation SID 91 Digest); pp. 565–566.

PROCESS FOR FABRICATING AN ACTIVE MATRIX CIRCUIT

This is a continuation of copending application Ser. No. 07/855,523 filed on Mar. 23, 1992, now U.S. Pat. No. 5,352,634.

FIELD OF THE INVENTION

This invention is related to a method of fabricating integrated circuits, more specifically to a method of fabricating active matrix circuits in which resist masks are applied directly to the circuit during manufacture.

BACKGROUND OF THE INVENTION

Printed circuits were originally made by taking a flat substrate of insulating material and, with a printing press, applying conducting material to the insulation. Later it was realized that it would be easier to make printed circuits by coating the entire insulated board with a film of metal and then etching away those areas where a conductor is not desired. Under this method, the printed circuit board was made by taking a metal coated board and applying to it a pattern of acid-resistant material, called resist. Then the board, clad with metal and resist, was dipped in an acid bath, removed after an appropriate time and washed, leaving on the board only the desired conducting areas, the acid having removed those areas of the metal which were left unprotected by the resist.

An alternative technology for fabricating circuits, known as thick film technology, has been used principally from the early 1960's. It is a process for creating an entire circuit by direct printing. In thick film technology, an insulating substrate, usually ceramic, is used as a base upon which a conductive ink is deposited. A conductive ink can be created by suspending silver particles, or the like, in a carrier. It is this conductive ink which is printed directly on the circuit. In a similar manner, a resistor can be applied to the circuit by using a resistive material suspended in the carrier in place of silver and printing this resistive material (not to be confused with "resist") directly onto the base and creating the circuit, commonly by silk screening. There are similar techniques for creating capacitors and inductors in this manner. The technology is referred to as thick film because of the depth of material that is supplied to the substrate. This depth is relatively thick (often hundreds of microns). Thick film technology has limited application to integrated circuit manufacture and is not suitable for active matrix arrays, in which elements must be thin and small.

The technology that was developed for creating integrated circuits, which was perfected after the 1960's, is photolithography in which there is no physical contact between the integrated circuit being created and the machinery creating it. After the conducting or semiconducting surface is applied, a photosensitive resist layer is applied on top. The photosensitive resist layer is then exposed to light in a selective manner determined by a photographic mask pattern. The mask pattern is created by graphically drawing a mask, photographing it and using the resulting negative to project light onto the photosensitive resist layer. This exposes the resist in certain places and, depending on whether it is a positive or negative resist, there is a chemical change during the exposure which makes the resist either impervious or not impervious to acid. The circuit is then bathed in acid to etch away all but the desired circuit and, in this manner, it is possible to create an integrated circuit without any physical contact with the surface being dealt with. Photolithography permits the creation of extremely small circuit elements because the wavelength of visible light permits high resolution. By the mid 1970's, the microelectronics industry was almost exclusively using photoresist technology in the production of microelectronic circuits. In a 1975 book, *Photoresist: Materials And Processes*, W. S. DeForest stated, "Today the entire semiconductor industry is dependent on the use of photoresists for the manufacture of their devices and circuits. Numerous photoetching steps are employed sequentially in order to form the various active and passive components of the circuit."

The current practice in the industry is Si integrated circuits and this has carried over into the production of active matrix circuits in which devices are constructed from amorphous films in contrast to the single crystal material generally used for integrated circuits. These films exhibit low carrier mobility necessitating small line widths, short device channels and great alignment accuracies.

The need in conventional integrated circuit technology for small line widths and extremely complex masks has motivated development of successively more sophisticated lithography and etching techniques, including x-ray lithography and electron and ion beam etch. These techniques require concomitantly slower and more expensive equipment. For example, ion beam etching requires the circuit to be placed in a vacuum chamber, which is expensive and precludes rapid manufacture. Direct printing is thought by the art to be unsuitable for integrated circuit manufacture because:

1. the required narrow line widths cannot be achieved;
2. the substrate cannot be registered accurately through multiple passes to allow formation of multiple layers; and
3. the pressure required to print on an integrated circuit would damage layers previously fabricated.

An active matrix is one type of integrated circuit in which elements may be selectively caused to emit or modulate light. Active matrix technology is a technology used in, for example, flat panel television screens in which a semiconductor matrix is created; each individual cell of which can be activated by an electrical signal sent down the matrix in the x and y directions. The production of such an active matrix has been very expensive due to the use of conventional stepping engines that step and repeat a particular pattern many times for each layer of each matrix being manufactured.

High-definition television (HDTV) will begin to be available in commercial products. Some test programs of HDTV have already been aired. Furthermore, several companies have announced a new cathode-ray tube (CRT) displays for HDTV. Flat type displays which utilize active matrix technology should be most favorable for HDTV because CRT displays for HDTV's can be very large, cumbersome and heavy. Recently, liquid crystal display (LCD) technology has brought about a large advance in flat panel displays. Thin film transistor (TFT) technology has realized high resolution and large area LCD's. Furthermore, 10" diagonal LCD's with 640×480 pixels are already commercially available.

Manufacturers are carrying out a great deal of research aimed at further definition and larger panel sizes.

HDTV is fundamentally a large screen medium. Therefore, a size of more than 40" diagonal and full color display is preferably required. TFT-LCD's, or active matrices, are currently made by a photolithographic technique, however, it is very difficult to apply this technique to fabricate a large active matrix LCD for HDTV because the size of the matrix for HDTV becomes very large.

One of the important problems in such flat panel fabrication is the process of patterning fine components on a large scale with good registration and reproduction. The steps of photolithography have been involved in the conventional method and require bulky and expensive equipment with low throughput. If the step and repeat process can be replaced by a single printing technique having processing abilities for large areas with a high throughput, substantial contributions may be obtained for mass production of large size panels with low initial investment.

A considerable number of individual process steps required in the fabrication of flat panels have been heretofore required in photolithography. An abbreviated list of the steps involved in each photolithographic step is as follows:

1. spin-on, or otherwise deposit, photoresist film;
2. bake;
3. align in exposure system;
4. expose pattern on resist;
5. for larger area substrates, step to another region and repeat exposure to cover total area;
6. develop;
7. rinse and dry; and
8. inspect panel with possible reworking.

These steps must be repeated for each successive mask layer, of which there are usually four or more. Note that the present photolithographic process requires a considerable amount of handling of individual substrates. Steps 4 and 5 must be performed individually and become an increasingly important bottleneck as display areas increase. A photoresist pattern representing a small subset of the entire layer (a 2"×2" photoresist pattern, for example) is projected onto an area and this must be repeated several times to encompass the entire layer of the active matrix. The stepping engine must be precise for proper alignment with each step. The expensive part of this process is the time involved and the expense of the machine involved in doing the stepping and the repeating of the photoresist patterns.

SUMMARY OF THE INVENTION

It is the object of the present invention to overcome the aforementioned deficiencies of the prior art. It is another object of the present invention to improve the speed, and cost associated with large-scale manufacturing of integrated circuits. It is a further object of the present invention to improve the speed and cost of manufacture of an active matrix, such as those used in flat panel displays.

These objects are achieved, principally, through the printing of the resist patterns onto the integrated circuiting a single, rapid process. A simple, inexpensive process for patterning, based on well-known and well-controlled processes used in the printing industry, achieves this cost and time savings. Present printing processes achieve remarkably high resolution and overlay accuracies in color printing. Line widths as fine as $4\mu$ can beg printed over areas as large as one square meter with registration accuracy as good as $2\mu$. The achievable line width and registration accuracy is sufficient for the fabrication of both matrix and peripheral driver transistors of high-mobility semiconductors such as CdSe, poly-Si or poly-Ge.

The concept of the present invention is to form a printing plate with the entire etch-resist pattern required for a particular level of the circuit, and to print this etch-resist pattern directly on the integrated circuit by an offset technique. The original plate can be patterned using currently available optical steppers or even with the use of large area contact plate-making processes, as is commonly used in the printing industry. Since the printing press can produce many prints at great speed, costs are greatly reduced. The present very expensive and time-consuming steps in forming the resist pattern on the actual circuits in fabrication are transformed in the present method into a single, very rapid printing step. These and other objects and advantages of the present invention will become more apparent when described in connection with the attached drawings.

DESCRIPTION OF THE PREFERRED EMBODIMENTS

The present method comprises applying an etch-resist pattern to an integrated circuit, which is preferably made of high-mobility material, by printing to form resist patterns having line widths and spacings ranging from about $4\mu$–$25\mu$. However, it should be realized that the present process may work for line widths outside this range. The circuit is then etched, recoated with a different substance, a new resist pattern applied and the pattern repeated to form the successive layers of the integrated circuit. As noted above, the method is particularly useful in fabricating flat panel displays in which, by judicious choice of materials, line widths and spacings in the indicated range is effective.

While printing presses are not typically used to print photoresist, they are used with inks having similar chemical and rheological properties. Printing is normally done with cylindrical presses, in which the flexible paper substrate is bent around one cylinder and pressed against a printing surface which is formed around an adjacent touching cylinder. This standard type of printing press would not be applicable to the current process since the print must be applied to a rigid substrate.

Figure 1:
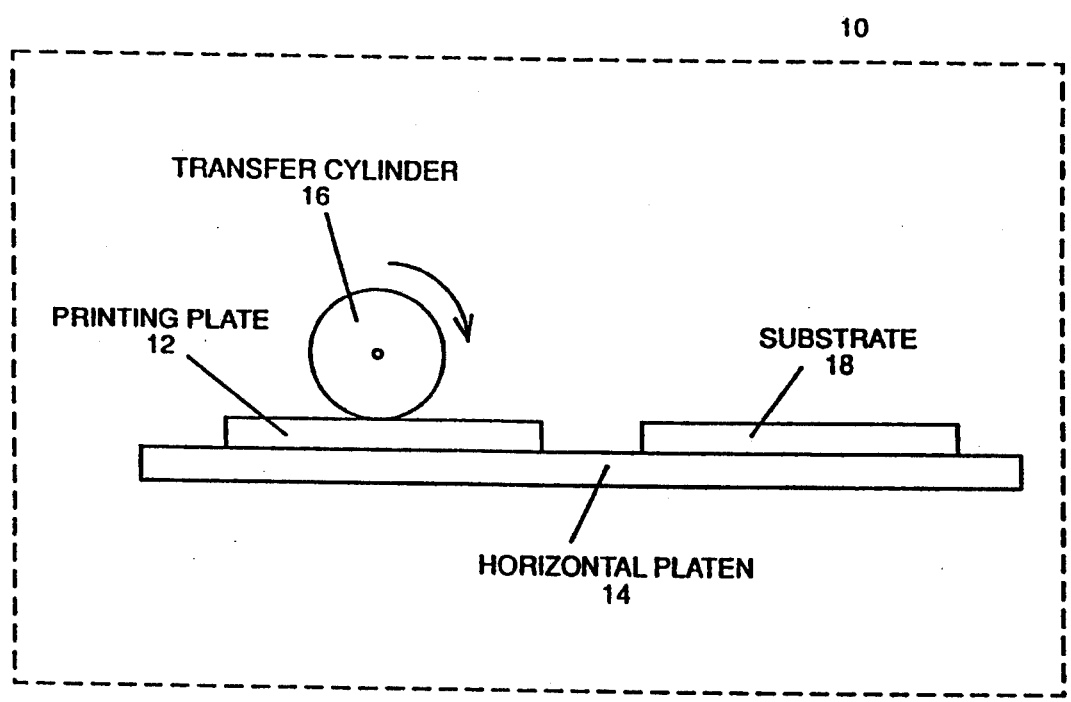
FIG. 1 illustrates a conventional offset letter-press machine of the type utilized in the present invention.

There are, however, so-called "offset letter-press" machines available in which paper is held flat and is passed horizontally under the printing cylinder. FIG. 1 illustrates the configuration of such a machine. The process of using such a machine is referred to as offset printing since the printing plate itself does not contact the object being printed. The term offset printing refers to a variety of printing processes where the printing plate does not contact the object being printed; but ink is first transferred to an intermediate surface before being applied to the object being printed.

In an offset letter-press machine 10 the printing plate 12 is positioned on a horizontal platen 14. The printing plate 12 is inked by inking rollers (not shown) in a conventional fashion. The inking rollers may be removed and the inking of the printing plate 12 accomplished by hand, which is useful in low volume proofing operations. The inked printing plate 12 passes under the transfer cylinder 16 onto which the desired printed etch-resist pattern is transferred. The substrate 18 passes under the transfer cylinder 16 and the desired printed etch-resist pattern is transferred to the substrate 18. The platen 14 reciprocates such that the entire process may be repeated for a second substrate.

Figure 2:
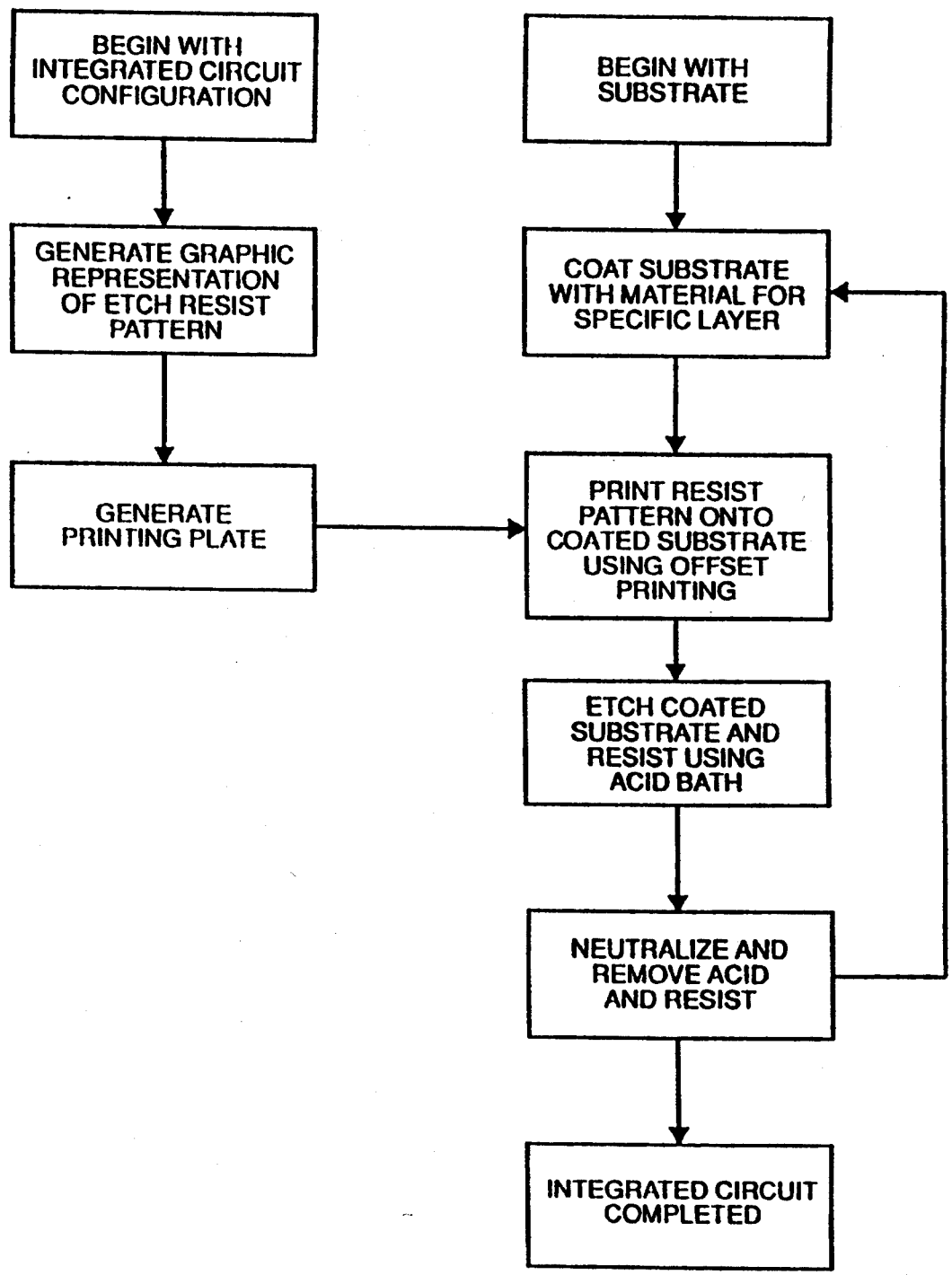
FIG. 2 represents a schematic flow chart of the process according to the present invention.

FIG. 2 illustrates, schematically, the process of the present invention.

Prior to the formation of the integrated circuit, the printing plate must be produced. The plate will contain the entire resist pattern for an individual layer of the integrated circuit. Separate printing plates 12 may be produced, one associated with each layer of the integrated circuit. However, it is also possible to position multiple etch-resist patterns at spaced, distinct locations on the printing plate such that multiple layers of an integrated circuit,can be produced by a single printing plate 12. For example, the left side of the printing plate 12 may contain the etch-resist pattern for the first layer of the integrated circuit and the right side of the printing plate 12 may contain the etch-resist pattern for the second layer. A graphic representation of the desired resist pattern is initially produced. Unlike photolithographic techniques where such a graphic representation may represent only a portion of the matrix, the present process provides for the graphic representation of the resist pattern of one layer of the whole active matrix. This representation may be larger than the actual size of the active matrix itself. From this graphic representation, the actual printing plate 12 may be generated. The printing plate 12 may be generated using exposure systems currently used in the printing industry. The printing plate 12 differs from the film of the photolithographic process in that the printing plate 12 contains the resist pattern for an individual layer of the entire matrix as opposed to only one portion or segment of the resist pattern for the entire layer which is found on the film of the photolithographic technology. The etch-resist pattern on the printing plate 12 is, preferably, constructed in a one-to-one size relationship with the active matrix.

When forming the integrated circuits by the present invention, the substrate is coated with a material which will form the initial layer. A resist pattern is applied to the substrate and coating by means of an offset printing machine (as noted above); the resist forms etch-resist patterns that can achieve line widths and spacings below $8\mu$. The circuit is then etched by being dipped into an etch bath to remove all of the coating except that which is below the resist. Such etch baths are well-known in the art. Consequently, the resulting circuit, like the etch-resist pattern, may have line widths and spacings narrower than $8\mu$, which is sufficient to fabricate an active matrix array. The substrate and coating is then placed in a neutralizing and cleaning solution which will remove any excess etchant, as well as the applied resist pattern, leaving only the desired circuit in the initial layer. The circuit is then recoated with a different second layer, a new resist pattern is applied, again by offset printing, the substrate is dipped in an etch bath, then a neutralizing and cleaning solution and the process is repeated until all of the layers are completed.

A printing press which is adapted to handle a substrate of 24"×24" size would be at least 4' wide and 10' long. The printing press which is used to perform the method of the present invention may utilize a coated ground cylinder for improved results. Additionally, air bearings to reduce friction in the printer mechanisms and the slide, and a band or cable drive rather than gear drive for the cylinder, will improve the printing of the resist pattern. A vacuum table with hand-adjustable stages will allow for the correct placement of the substrate for the required registration. A laser auto collimator may also be included to maintain, check and correct required quality. There are a number of specific offset printing presses which are satisfactory in performing this method such as, for example, a Vandergook proofing press, which has been successfully used in experiments of the method of the current invention. Another suitable type of offset press is manufactured by Geiger Tool & Manufacturing Co. of Passaic, N.J. These offset printing presses can achieve the required line widths and resolution needed to print resist pattern on an active matrix circuit according to the method of the present invention.

Regarding the specific resist, it is important to note that conventional printing ink, such as Van Son Tough Tex Black, has proven to serve as a reasonably satisfactory etch-resist; however, a varnish without pigment particles may improve the resolution and sharpness of the resulting patterns.

The process has already achieved line widths under $10\mu$, which is quite satisfactory for use in active matrices. In an initial experiment on the process of the current invention, a Vandergook proofing press was used. A flat glass substrate, about 5"×5" square, was coated with chromium, forming a layer on the substrate. A test resist pattern was printed on the substrate. A conventional printing ink, Van Son Tough Tex Black, was used to form the resist. The coated substrate with resist was placed into a CR-etch bath consisting of ceric ammonium nitrate. The test resist pattern contained twelve sets of concentric circles, with the lines of each set having a specific line width, The twelve line widths tested were lines having widths of $70\mu$, $55\mu$, $40\mu$, $25\mu$, $15\mu$, $12\mu$, $10\mu$, $8\mu$, $6\mu$ and $4\mu$. In this test of the process of the present invention, line widths down to and including the $8\mu$ line width proved to be consistent enough for use in active matrices. It is believed that the use of varnishes rather than inks and printers with higher quality printing cylinders and drives will allow the present method to successfully print sufficient line widths and spacings of $4\mu$ or below.

Substantial manufacturing cost savings will occur utilizing the method of the present invention. These cost savings will occur due to first, much higher throughput and second, much lower equipment and labor costs. The printing process of the present invention can achieve a throughput of 360,000 square inches per hour or higher, which is much greater than prior art active matrix processes currently in use which are capable of producing only up to 12,000 square inches per hour. As can be seen, the increase in throughput is significant. The labor cost for the entire circuit fabrication can be decreased by more than half since several of the more tedious and time-consuming steps have been eliminated. The cost of the equipment is greatly reduced since a conventional printing press and the required plotter costs approximately one-seventh as much as the equipment needed for current photolithographic techniques. With the applicable throughputs of the prior art method, the cost of generating the etch-resist pattern of a single layer is approximately 4 cents per square inch. However, with the process of the current invention, costs of 0.03 cent per square inch can be achieved. Consequently, the process of the present invention could reduce the per square inch cost of the patterning of active matrix circuits by a factor of 100 or greater.

The method of the present invention may be embodied in other specific forms without departing from the spirit or scope of the present invention. The present embodiments of this method are therefore to be considered in all respects as illustrative and not restrictive. The scope of the invention is indicated by the appended claims rather than the foregoing description. All embodiments which come within the meaning and range of equivalency of the claims are therefore intended to be embraced therein.

I claim:

1. A method of manufacturing integrated circuits having at least one layer, comprising the steps of:
   coating a substrate with a conductive material forming a single layer of the circuit;
   applying an etch-resist pattern having line widths and spacings range from about $4\mu$–$25\mu$ to at least one layer of said coated substrate by printing said resist pattern onto said coated substrate; and
   placing said coated substrate with resist pattern in a bath to etch away desired portions of the coated substrate.

2. The method of claim 1 wherein said printing of said resist pattern is offset printing.

3. The method of claim 2 wherein said offset printing is accomplished with an offset letter-press machine.

4. The method of claim 1 wherein said etch-resist pattern is made of a varnish.

* * * * *

UNITED STATES PATENT AND TRADEMARK OFFICE
CERTIFICATE OF CORRECTION

PATENT NO.   : 5,426,074
DATED        : June 20, 1995
INVENTOR(S)  : Thomas P. Brody It is certified that error appears in the above-indentified patent and that said Letters Patent is hereby corrected as shown below:

Title page, in section [56] References Cited, U.S. PATENT DOCUMENTS, "4,505,685 3/1985 Tischler et al. ... 445/24" should read --4,505,685 3/1985 Tischer et al. ... 445/24--.

Title page, in section [56] References Cited, U.S. PATENT DOCUMENTS, "6,803,136 2/1989 Bowsky et al. ... 429/56" should read --4,803,136 2/1989 Bowsky et al. ... 429/56--.

Title page, in section [56] References Cited, OTHER PUBLICATIONS, in the *McGraw-Hill*, vol. 14, reference, "Encyclopdeia" should read --Encyclopedia--.

Column 3 Line 54 "speed,and" should read --speed and--.

Column 3 Lines 60-61 "circuit-ing" should read --circuit in--.

Column 3 Line 66 "beg" should read --be--.

Column 5 Line 21 "circuit,can" should read --circuit can--.

Signed and Sealed this

Seventeenth Day of October, 1995

Attest:

BRUCE LEHMAN

*Attesting Officer*   *Commissioner of Patents and Trademarks*